(12) United States Patent
Lin et al.

(10) Patent No.: US 12,402,338 B2
(45) Date of Patent: Aug. 26, 2025

(54) INSULATED GATE BIPOLAR TRANSISTOR DEVICE

(71) Applicant: SUZHOU ORIENTAL SEMICONDUCTOR CO., LTD., Jiangsu (CN)

(72) Inventors: Minzhi Lin, Jiangsu (CN); Lei Liu, Jiangsu (CN); Wei Liu, Jiangsu (CN); Yuanlin Yuan, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 18/016,919

(22) PCT Filed: Jul. 21, 2022

(86) PCT No.: PCT/CN2022/107086
§ 371 (c)(1),
(2) Date: Jan. 19, 2023

(87) PCT Pub. No.: WO2023/109124
PCT Pub. Date: Jun. 22, 2023

(65) Prior Publication Data
US 2024/0250159 A1     Jul. 25, 2024

(30) Foreign Application Priority Data
Dec. 15, 2021 (CN) .......... 202111534459.6

(51) Int. Cl.
*H10D 12/00*    (2025.01)
*H10D 62/10*    (2025.01)
*H10D 64/27*    (2025.01)

(52) U.S. Cl.
CPC ......... *H10D 12/481* (2025.01); *H10D 62/126* (2025.01); *H10D 64/513* (2025.01)

(58) Field of Classification Search
CPC .. H10D 12/481; H10D 62/126; H10D 64/513; H10D 12/00; H10D 48/30;
(Continued)

(56) References Cited

FOREIGN PATENT DOCUMENTS

| CN | 107527948 A | 12/2017 |
|----|-------------|---------|
| CN | 109755238 A | 5/2019  |

(Continued)

OTHER PUBLICATIONS

PCT/CN2022/107086 International Search Report dated Aug. 31, 2022.

*Primary Examiner* — Mohammad A Rahman
(74) *Attorney, Agent, or Firm* — Michael Best & Friedrich LLP

(57) ABSTRACT

An IGBT device includes an p-type collector region, an n-type semiconductor layer, several p-type body regions located in the n-type semiconductor layer, a gate trench located in the n-type semiconductor layer and between adjacent p-type body regions, a gate trench located in the n-type semiconductor layer and between adjacent p-type body regions, a shielded gate located in a lower part of the gate trench, and a gate located in an upper part of the gate trench. The gate, the shielded gate, and the n-type semiconductor layer are insulated and isolated from each other. Among the several p-type body regions, at least one p-type body region has a first doping concentration and is defined as a first p-type body region, and at least one p-type body region has a second doping concentration and is defined as a second p-type body region.

6 Claims, 1 Drawing Sheet

(58) Field of Classification Search
CPC ...... H10D 62/10; H10D 62/127; H10D 62/13;
H10D 62/17; H10D 62/393; H10D
64/117; H10D 64/27; H10D 84/645;
H10D 62/124; H10D 62/149; H10D
64/311; H10D 12/491; H10D 12/038;
H10D 84/641; Y02B 70/10
See application file for complete search history.

(56) References Cited

FOREIGN PATENT DOCUMENTS

| | | | | |
|---|---|---|---|---|
| CN | 209087847 U | | 7/2019 | |
| CN | 110137249 A | * | 8/2019 | ........... H01L 21/331 |
| CN | 111312814 A | | 6/2020 | |

* cited by examiner

INSULATED GATE BIPOLAR TRANSISTOR DEVICE

CROSS-REFERENCE TO RELATED APPLICATION(S)

This is a national stage application filed under 37 U.S.C. 371 based on International Patent Application No. PCT/CN2022/107086, filed Jul. 21, 2022, which claims priority to Chinese Patent Application No. 202111534459.6 filed with the China National Intellectual Property Administration (CNIPA) on Dec. 15, 2021, the disclosure of which is incorporated herein by reference in its entirety.

TECHNICAL FIELD

The present application belongs to the technical field of semiconductor power devices, for example, an IGBT device.

BACKGROUND

An insulated gate bipolar transistor (IGBT) device is a device compounded by a metal oxide semiconductor (MOS) transistor and a bipolar transistor. An input pole of the IGBT device is the MOS transistor. An output pole of the IGBT device is a PNP transistor. Combining features of the two transistor devices, the IGBT device is equipped with both features (that is, a low driving power and a high on-off speed) of the MOS transistor, and features (that is, a low saturation voltage drop and a large capacity) of the bipolar transistor. For the IGBT device, due to a relatively low hole injection efficiency at a boundary between a p-type body region and an n-type drift region, a carrier concentration distribution is low, causing the saturation voltage drop to rise. When the IGBT device turns off, a large number of minority carriers are stored in the n-type drift region, resulting in a serious phenomenon of a tailing turning-off current of the IGBT device and leading to a large turning-off loss.

SUMMARY

The present application provides an IGBT device to reduce the turning-off loss of the IGBT device.

The present application provides an IGBT device. The IGBT device includes a p-type collector region, an n-type semiconductor layer located above the p-type collector region, several p-type body regions located in the n-type semiconductor layer, a gate trench located in the n-type semiconductor layer and between adjacent p-type body regions, a shielded gate located in a lower part of the gate trench, and a gate located in an upper part of the gate trench.

An n-type emitter electrode region is disposed in each p-type body region.

The gate, the shielded gate, and the n-type semiconductor layer are insulated and isolated from each other.

Among the several p-type body regions, at least one p-type body region has a first doping concentration and is defined as a first p-type body region, and at least one p-type body region has a second doping concentration and is defined as a second p-type body region. The first doping concentration of the first p-type body region is smaller than the second doping concentration of the second p-type body region.

At least one shielded gate in at least one gate trench adjacent to the first p-type body region is externally connected to a gate voltage. A shielded gate in a remaining gate trench is externally connected to an emitter electrode voltage.

DETAILED DESCRIPTION

The solution of the present application is described hereinafter through specific implementations in conjunction with drawings in embodiments of the present application. Apparently, the described embodiments are part, not all, of embodiments of the present application. Meanwhile, to illustrate embodiments of the present application clearly, in the schematic views illustrated in BRIEF DESCRIPTION OF DRAWINGS, thicknesses of layers and regions described in the present application are enlarged, and dimensions illustrated in the views do not represent the actual dimensions.

Figure 1:
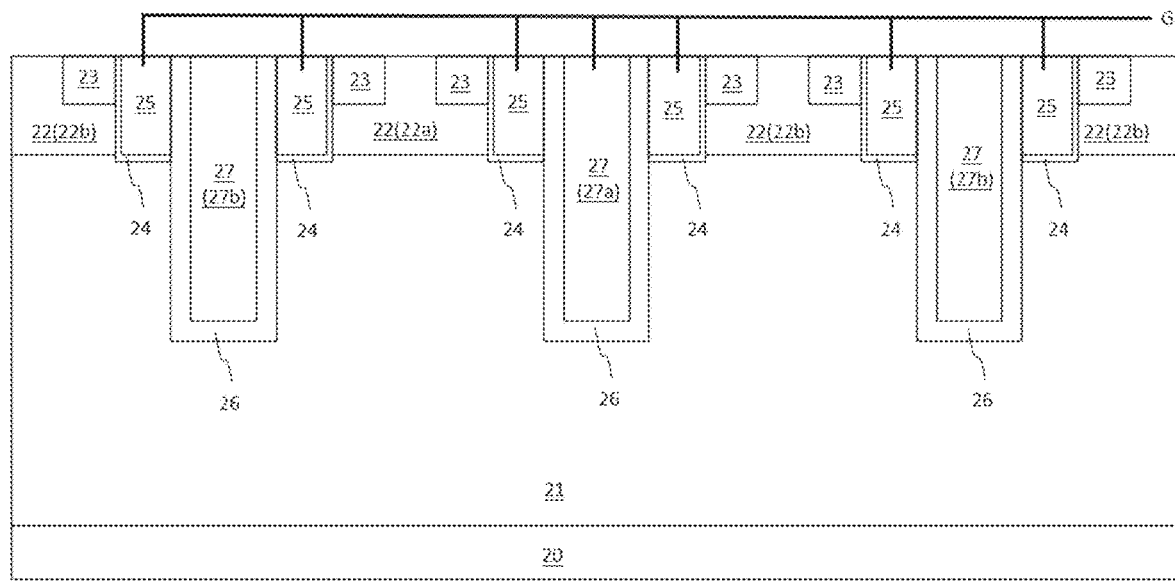
FIG. 1 is a section view of an IGBT device in a first embodiment according to the present application.

FIG. 1 is a section view of an IGBT device in a first embodiment according to the present application. As shown in FIG. 1, the IGBT device in the present application includes a p-type collector region 20, an n-type semiconductor layer 21 located above the p-type collector region 20, and several p-type body regions 22 located in the n-type semiconductor layer 21. An n-type emitter electrode region 23 is disposed in each p-type body region 22.

The IGBT device also includes a gate trench located in the n-type semiconductor layer 21 and between adjacent p-type body regions 22, a gate 25 located in an upper part of the gate trench, and a shielded gate 27 located in a lower part of the gate trench. The shielded gate 27 may be merely located in the lower part of the gate trench so that the gate 25 and the shielded gate 27 are an upper and lower structure. Optionally, the shielded gate 27 may also be located in the lower part of the gate trench and extend upward into the upper part of the gate trench. FIG. 1 illustrates an example in which the shielded gate 27 is located in the lower part of the gate trench and extends upward into the upper part of the gate trench. Moreover, the width of the upper part of the gate trench may be greater than, equal to, or smaller than the width of the lower part of the gate trench. FIG. 1 illustrates that the width of the upper part of the gate trench is greater than the width of the lower part of the gate trench.

The gate 25, the shielded gate 27, and the n-type semiconductor layer 21 are insulated and isolated from each other. In FIG. 1, the gate 25 is insulated and isolated from the n-type semiconductor layer 21 through a gate dielectric layer 24, and the shielded gate 27 is isolated from the gate 25 and the n-type semiconductor layer 21 through a field oxide layer 26.

In the several p-type body regions 22 in the present application, embodiments of the present application exemplarily show four p-type body regions 22. At least one p-type body region 22 has a first doping concentration and is defined as a first p-type body region 22a. At least one p-type body region 22 has a second doping concentration and is defined as a second p-type body region 22b. The first doping concentration of the first p-type body region 22a is smaller than the second doping concentration of the second p-type body region 22b. FIG. 1 exemplarily illustrates one first p-type body region 22a and three second p-type body regions 22b.

For the IGBT device in the present application, at least one shielded gate 27 in at least one gate trench adjacent to the first p-type body region 22a is externally connected to a gate voltage. A shielded gate 27 in a remaining gate trench is externally connected to an emitter electrode voltage. In FIG. 1, exemplarily, a shielded gate 27 in a gate trench on the right of the first p-type body region 22a and a gate 25 are externally connected to the gate voltage (G). Shielded gates 27 in the remaining gate trenches (that is, gate trenches other than the gate trench where the shielded gate externally connected to the gate voltage is located) and n-type emitter electrode regions 23 are externally connected to the emitter electrode voltage (not shown).

For the IGBT device in the present application, a threshold voltage Vth1 of a current channel in the first p-type body region 22a with the first doping concentration is smaller than a threshold voltage Vth2 of a current channel in the second p-type body region 22b with the second doping concentration. When a shielded gate 27 is externally connected to the gate voltage, a gate 25 in the gate trench has a greater gate charge Qg1. When a shielded gate 27 is externally connected to the emitter electrode voltage, a gate 25 in the gate trench has a smaller gate charge Qg2. The arrangement in which at least one shielded gate 27 in at least one gate trench adjacent to the first p-type body region 22a is externally connected to the gate voltage and a shielded gate 27 in a remaining gate trench is externally connected to the emitter electrode voltage enables the small Vth1 to be combined with the great Qg1 and enables the great Vth2 to be combined with the small Qg2. Accordingly, in a process in which the IGBT device turns off from turning on, a current channel in a region where the great Vth2 is combined with the small Qg2 may turn off rapidly, while a current channel in a region where the small Vth1 is combined with the great Qg1 may turn off later. In this case, when the current channel in the region where the great Vth2 is combined with the small Qg2 just turns off, the current channel in the region where the small Vth1 is combined with the great Qg1 is still in the on state. With a further reduction of the gate voltage Vg, the current channel in the region where the small Vth1 is combined with the great Qg1 turns off. Therefore, as an external manifestation of the IGBT device, a turning-off loss of the region where the small Vth1 is combined with the great Qg1 reduces a turning-off loss of the region where the great Vth2 is combined with the small Qg2, thereby reducing a turning-off loss of the IGBT device entirely.

Figure 2:
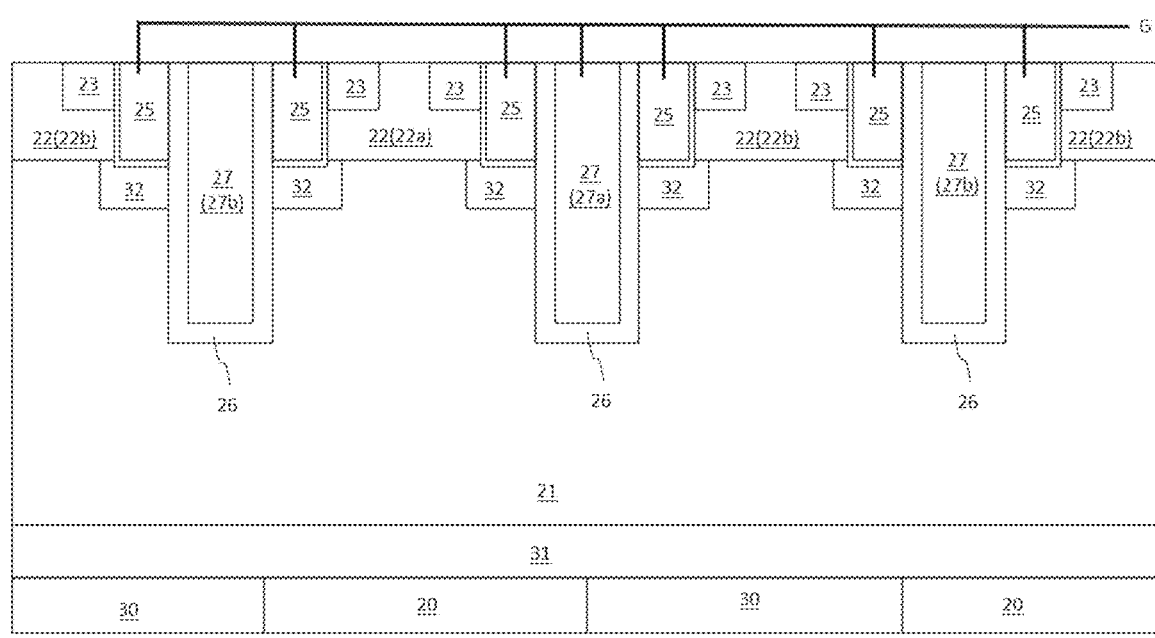
FIG. 2 is a section view of an IGBT device in a second embodiment according to the present application.

FIG. 2 is a section view of an IGBT device in a second embodiment according to the present application. As shown in FIG. 2, on the basis of the structure of the IGBT device shown in FIG. 1, the IGBT device in the present application further includes an n-type charge storage region 32 located in the n-type semiconductor layer 21. The n-type charge storage region 32 is located below the gate 25. The IGBT device in the present application further includes n-type collector regions 30. The n-type collector regions 30 are located below the n-type semiconductor layer 21. Moreover, the n-type collector regions 30 and the p-type collector regions 20 are disposed alternately. Optionally, the IGBT device in the present application may further include an n-type field cutoff region 31. The n-type field cutoff region 31 is located between the p-type collector region 20 and the n-type semiconductor layer 21. The n-type charge storage region 32, the n-type field cutoff region 31, and the n-type collector region 30 are all known technology and are not described in detail in embodiments of the present application.

What is claimed is:

1. An IGBT device, comprising:
a p-type collector region;
an n-type semiconductor layer located above the p-type collector region;
a plurality of p-type body regions located in the n-type semiconductor layer, wherein an n-type emitter electrode region is disposed in each of the plurality of p-type body regions; and
gate trenches each located in the n-type semiconductor layer and between adjacent p-type body regions among the plurality of p-type body regions, shielded gates each located in a lower part of one of the gate trenches, and gates each located in an upper part of one of the gate trenches, wherein each of the gates, each of the shielded gates, and the n-type semiconductor layer are insulated and isolated from each other,
wherein among the plurality of p-type body regions, at least one p-type body region has a first doping concentration and is defined as a first p-type body region, and at least one p-type body region has a second doping concentration and is defined as a second p-type body region; and the first doping concentration of the first p-type body region is smaller than the second doping concentration of the second p-type body region; and
wherein at least one of the shielded gates in at least one of the gate trenches adjacent to one first p-type body region is externally connected to a gate voltage, and a shielded gate in a gate trench, which is other than the at least one gate trench where the at least one shielded gate externally connected to the gate voltage, is located is externally connected to an emitter electrode voltage.

2. The IGBT device according to claim 1, wherein each of the shielded gates extends from the lower part of one of the gate trenches into the upper part of one of the gate trenches.

3. The IGBT device according to claim 2, wherein a width of the upper part of each of the gate trenches is greater than a width of the lower part of the each of the gate trenches.

4. The IGBT device according to claim 3, further comprising n-type charge storage regions located in the n-type semiconductor layers, wherein each of the n-type charge storage regions is located below the gate.

5. The IGBT device according to claim 1, further comprising n-type collector regions, wherein the IGBT device comprises a plurality of p-type collector regions, the n-type collector regions are located below the n-type semiconductor layer, and the n-type collector regions and the plurality of p-type collector regions are disposed alternately.

6. The IGBT device according to claim 1, further comprising an n-type field cutoff region, wherein the n-type field cutoff region is located between the p-type collector region and the n-type semiconductor layer.

* * * * *